United States Patent
Shipley et al.

(10) Patent No.: US 8,842,398 B2
(45) Date of Patent: Sep. 23, 2014

(54) APPARATUS AND METHOD FOR ARC FAULT DETECTION

(75) Inventors: Adrian Shipley, Cheltenham (GB); Peter James Handy, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 129 days.

(21) Appl. No.: 13/596,617

(22) Filed: Aug. 28, 2012

(65) Prior Publication Data

US 2013/0293989 A1 Nov. 7, 2013

(30) Foreign Application Priority Data

May 1, 2012 (GB) .................................. 1207534.7

(51) Int. Cl.
*H02H 3/00* (2006.01)
*G01R 31/02* (2006.01)

(52) U.S. Cl.
USPC ........................................ 361/42; 324/763.01

(58) Field of Classification Search
CPC ..... H02H 1/0015; H02H 3/00; G01R 15/181; G01R 14/18; G01R 31/02
USPC ........................................ 361/42; 324/763.01
See application file for complete search history.

(56) References Cited

U.S. PATENT DOCUMENTS

| | | | |
|---|---|---|---|
| 5,818,671 A * | 10/1998 | Seymour et al. | 361/42 |
| 5,825,598 A | 10/1998 | Dickens et al. | |
| 5,834,940 A | 11/1998 | Brooks et al. | |
| 6,144,537 A | 11/2000 | Boteler | |
| 6,172,862 B1 | 1/2001 | Jonnatti et al. | |
| 6,222,713 B1 * | 4/2001 | Vix | 361/93.1 |
| 2003/0090356 A1 * | 5/2003 | Saito et al. | 336/213 |
| 2005/0207083 A1 | 9/2005 | Rivers, Jr. et al. | |
| 2006/0262466 A1 * | 11/2006 | Engel | 361/42 |
| 2010/0085669 A1 | 4/2010 | Rivers, Jr. | |

FOREIGN PATENT DOCUMENTS

EP 0649207 A1 4/1995

OTHER PUBLICATIONS

GB Search Report dated Jul. 17, 2012 issued in connection with corresponding GB Patent Application No. GB1207534.7.

* cited by examiner

*Primary Examiner* — Scott Bauer
(74) *Attorney, Agent, or Firm* — McGarry Bair PC

(57) ABSTRACT

An apparatus and method for detecting an arc fault using a power conductor on a printed circuit board (PCB), which supplies power from an external power source to electrical components on the PCB by sensing a value indicative of the rate of change of current passing through the power conductor. The apparatus and method may be used for detecting arc faults both internal and external to the PCB.

22 Claims, 5 Drawing Sheets

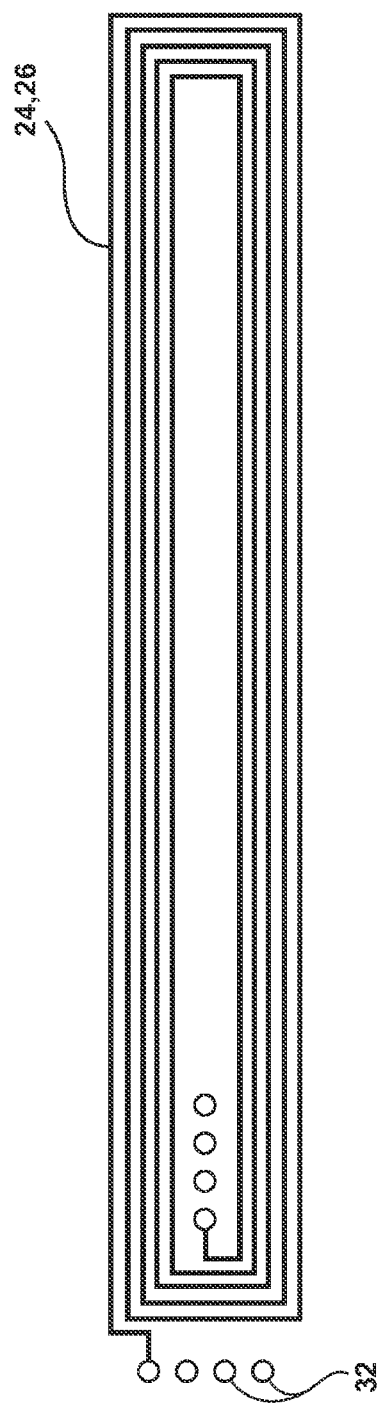
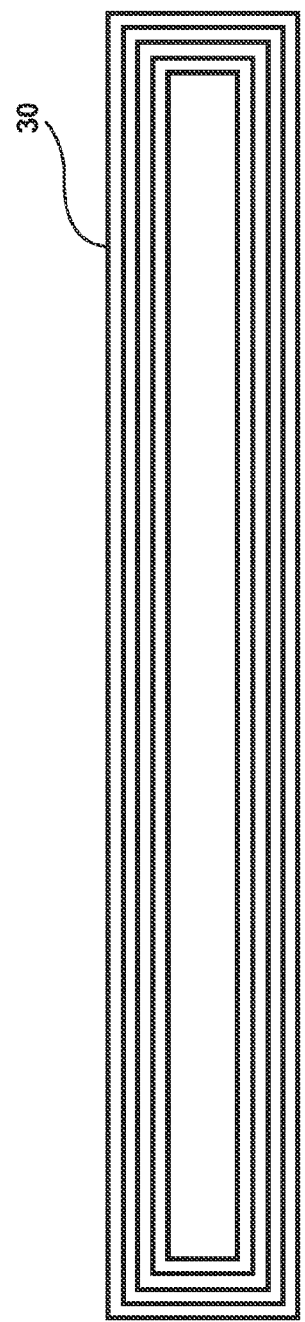
FIGURE 2A
FIGURE 2B

APPARATUS AND METHOD FOR ARC FAULT DETECTION

CROSS-REFERENCE TO RELATED APPLICATIONS

This application claims priority under 35 U.S.C. §119 to British Patent Application No. 12075347, filed May 1, 2012, the disclosure of which is incorporated herein by reference.

BACKGROUND OF THE INVENTION

Electrical circuits, such as those used in aircraft aviation systems may use relatively high voltage and are capable of supplying high current. Electrical faults such as an arc fault may occur therein and typically allow current to either flow through a conducting medium or jump across a nonconductive medium from one conductor to another. The ability to detect such arc faults is important because if not detected promptly, arc faults may develop into short circuits, malfunctions, and other problems in the equipment serviced by the electrical circuits.

BRIEF DESCRIPTION OF THE INVENTION

In one embodiment, a printed circuit board (PCB) includes a plurality of electrical components, a power conductor configured to couple to a power supply external to the PCB and provide power to the plurality of electrical components, and an arc fault detector including a first air-cored transformer located in proximity to the power conductor to couple with a magnetic field generated by current passing through the power conductor and providing an output voltage, Vout, that is proportional to the rate of change of the current, dI/dt, passing through the power conductor.

In another embodiment, a method of detecting an arc fault in a power conductor on a PCB includes sensing a value indicative of the rate of change of current passing through the power conductor by an air-cored transformer located on the printed circuit board, and determining an arc fault condition based on the sensed value.

BRIEF DESCRIPTION OF THE DRAWINGS

In the drawings:

FIG. 2A is a schematic illustration of exemplary coils which may be used with the PCB of FIG. 1.

FIG. 2B illustrates a simplified equivalent schematic of FIG. 2A allowing evaluation of the electromagnetic coupling parameters of the coil.

DESCRIPTION OF EMBODIMENTS OF THE INVENTION

Figure 1A:
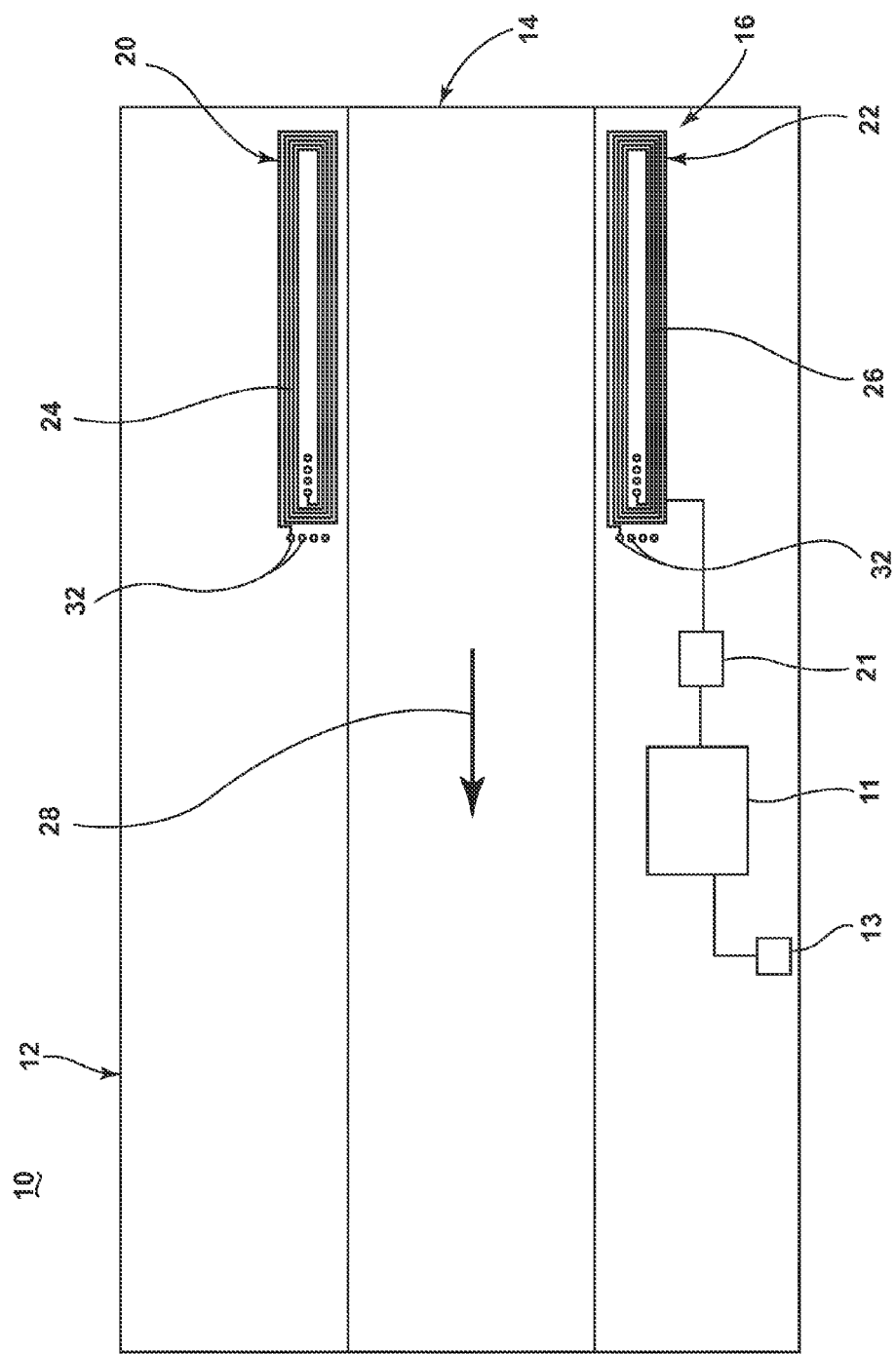
FIGS. 1A and 1B are schematic illustrations of a PCB according to an embodiment of the invention.

Embodiments of the invention involve using a PCB instantiated air-cored current transformer to detect the fast rate of change of current (dI/dt), which may be created in aircraft power distribution feeders, by way of non-limiting example, during series and parallel arc fault events. In historical arc fault detection systems, resistor-capacitor hardware differentiators have been used in order to determine the dI/dt from a Solid State Power Controller (SSPC) output current measurement circuitry. SSPCs are typically designed to read about 600% of their rated currents to function in the anticipated environment. Arc faults at high voltages create current disturbances in the order of only 5% of the rated current. Thus, the arc fault disturbance can be difficult to separate from the general noise of the circuit. SSPCs often use shunt resistors as a means of measuring the current passing through their terminals and the shunt resistors are sized according to the above range, which means that the signal-to-noise ratio available for arc fault detection is limited. Shunt resistors work well in low voltage applications, but lose the ability to discern the arc fault disturbance from the general noise of the circuit as the voltage increases. This difficulty may be illustrated with a look at specific examples.

In high voltage systems the change in output current due to a series arc fault becomes decreased in accordance with the equation:

$$\text{delta} I = (V\text{ARC}/V\text{LINE}) * I\text{LOAD} \tag{1}$$

In the contemplated environment, a typical arc fault event will result in a 20 volt signal. In a 28 volt DC system, the reduction in current during a 20 volt series arc fault event gives the following relationship: deltaI/ILOAD=20/28=0.714=71.4%. However, in a 270 volt DC system, the reduction in current during a similar 20 volt series arc fault event gives the following relationship: deltaI/ILOAD=20/270=0.074=7.4%. In a typical current monitoring system within a SSPC, the measurement range typically covers 0% to 600% of rated current. Typical loads applied to SSPCs are de-rated to around 75% of the rated current value, therefore, the change in current due to a series arc fault assuming a line voltage of 270 volt DC is 7.4% of the 75% load current and is only a 5.6% current value of the 600% full scale range. In contrast, in the 28 volt DC system, the de-rated load current is 53.6%, almost 10 times greater. The 5.6% current value as a proportion of the 600% range is only 0.93% of the 600% full scale range as compared to 8.9% for the 28 volt system. Such a 0.93% change in current due to the series arc fault is in the same order as that of the accuracy of the current monitoring system within the SSPC. The change for the 28 volt system is a magnitude higher. Thus, while the arc fault event in a 28 volt DC system is easily determined with the shunt resistor, the same is not true for the arc fault event in the 270 volt DC system.

The information that is required for arc fault detection purposes is purely the AC content of the DC signal which is supplying power to the given load. Therefore the DC content of signal can be ignored, and the AC coupling characteristic of the transformer can be used. Due to the high DC current levels in the system, a typical Iron-cored current transformer cannot be used due to issue of core saturation. The PCB instantiated air cored current transformer does not saturate and therefore solves this issue by ignoring any DC current components and providing dI/dt directly.

The invention provides a solution for determining arc fault events in high-voltage environments. One embodiment of the inventions is illustrated in FIG. 1A in the context of a PCB 10, which may include a board 12, having a plurality of electrical components (not shown for clarity), a power conductor 14, and an arc fault detector 16. The board 12 may be formed of any suitable material such as a substrate or laminate, which is generally thermally non-conductive. Various parts including memory, a microprocessor 11, and other electrical components 13 (e.g., resistors, diodes and capacitors) may be mounted to the board 12.

The power conductor 14 may be a bus bar or any other type of conductor provided on the board 12. For illustrative purposes, the power conductor 14 has been illustrated as a bus bar. The power conductor 14 may be configured to couple to a power supply (not shown) external to the PCB 10 to provide power to the plurality of electrical components located on the board 12. The external power source may be at least 60 volts and is contemplated to be higher including at least 220 volts.

The arc fault detector 16 is illustrated as including a first air-cored transformer 20 located in proximity to the power conductor 14 and a second air-cored transformer 22 wired in series with the first air-cored transformer 20. The arc fault detector 16 may also include a signal processing circuit or arc fault detection circuit 21. It is contemplated that the arc fault detection circuit 21 may provide an output to the microprocessor 11 and the microprocessor 11 may use the signal input to determine if there is an arc fault event. Alternatively, the arc fault detection circuit 21 may be coupled to the microprocessor 11 or may be part of the microprocessor 11 and may implement an algorithm, to detect the initial occurrence of an arc fault and determine an arc fault condition based on the sensed value.

Figure 1B:
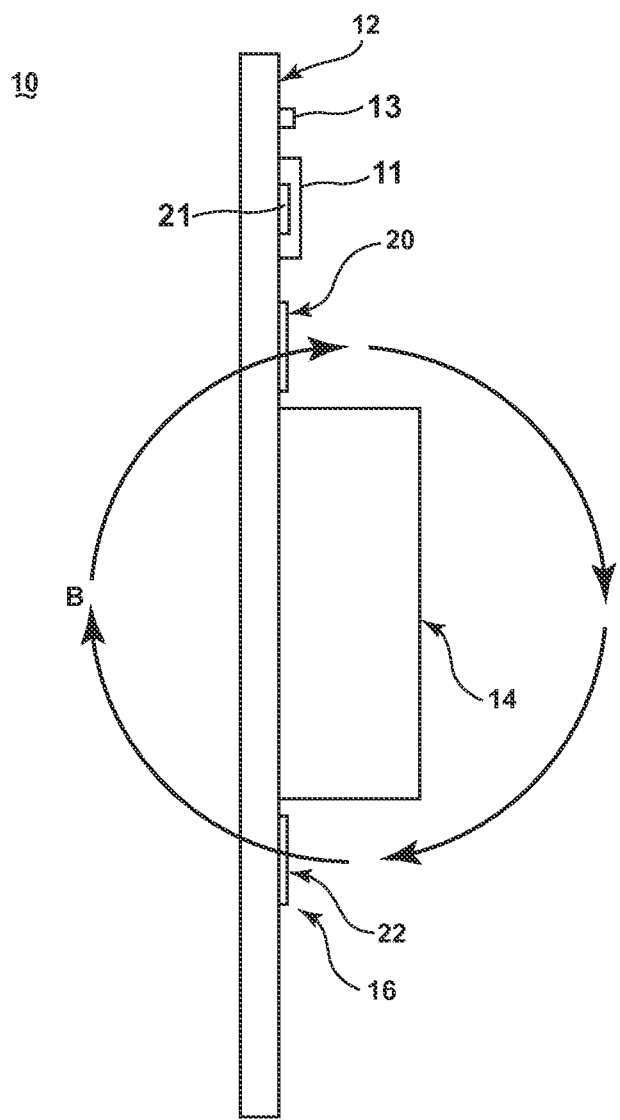

The first and second air-cored transformers 20 and 22 may be located proximate the power conductor 14 to constructively add positive and negative components of a magnetic field generated by the current passing through the power conductor 14. Each of the first and second air-cored transformers 20 and 22 may include a coil instantiated in the board. As may more clearly be seen in FIG. 1B, the first air-cored transformer 20 has been illustrated as including a first coil formed by a winding 24 and the second air-cored transformer 22 has been illustrated as including a second coil formed by a winding 26 wound in a same rotational direction as the winding 24. The first and second air-cored transformers 20 and 22 are wired anti-phase in this manner to effect the constructive adding of the positive and negative components of the magnetic field during operation.

The windings 24 and 26 are illustrated as including traces on the board 12 in the form of a spiral, which is better illustrated in FIG. 2A. The windings forming the ever decreasing rectangular spiral may be equivalent to the sum of many geometrically similar rectangles with different dimensions as shown by coil 30 in FIG. 2B. It is also contemplated that each coil may include multiple spirals arranged on different layers in the board 12 of the PCB 10. Note that only one coil is illustrated in the above described figures for the sake of simplicity. The openings 32 illustrate where multiple spirals on multiple layers of the PCB 10 may be wired in series.

The arc fault detector 16 may also include a relay or SSPC (not shown) that is responsive to the arc fault detector 16. The arc fault detector 16 may include circuitry (not shown) which controls a relay or SSPC (not shown) for uncoupling the power conductor 14 from the power supply when an arc fault is detected. Such a relay may include a circuit breaker or any other suitable mechanism for uncoupling the power conductor 14 from the power supply when an arc fault occurs and the specific manner in which the relay action is achieved does not affect the system described herein.

In operation, an arc fault may be detected in the power conductor 14 by the arc fault detector 16. The occurrence of the arc-fault is sensed by arc fault detector 16, which preferably measures the rate of change of electrical current I in the power conductor 14 as a function of time t, or dI/dt. During operation, the air-cored transformer may couple with a magnetic field (as illustrated by arrows B in FIG. 1A) generated by a current, illustrated schematically as arrow 28, passing through the power conductor 14 and providing an output voltage, Vout, which is proportional to the rate of change of the current, dI/dt, passing through the power conductor 14. In the illustrated embodiment, the voltage across the first and second air-cored transformers 20 and 22 may be Vout. The arc fault detector 16 may receive Vout and may determine a presence of an arc fault therefrom. More specifically, the arc fault detector 16 may sense a value indicative of the rate of change of current passing through the power conductor 14 and determine an arc fault condition based on the sensed value. The determination of an arc fault may be made based on whether the sensed value is in excess of a permitted maximum rate-of-change value. It will be understood that such a determination may easily be altered to be satisfied by a positive/negative comparison or a true/false comparison. For example, a less than threshold value can easily be satisfied by applying a greater than test when the data is numerically inverted. The permitted maximum rate-of-change value may be determined experimentally.

To determine an arc fault, the arc fault detector 16 senses the value from the first and second air-cored transformers 20 and 22 to constructively add positive and negative components of a magnetic field generated by the current passing through the power conductor 14. The transfer function may be derived between the bus bar current differential dI/dt and the coil output voltage Vout, given the parameters indicated. The coil voltage may be calculated using the equations:

$$V_{coil} = KM \frac{dI}{dt} \quad (2)$$

$$M = \Sigma_{r=0}^{N-1} \int_{a+rs}^{a+w-rs} \frac{\mu_0}{2\pi x}(l - 2rs)\,dx = \Sigma_{r=0}^{N-1} \left[\frac{\mu_0}{2\pi}(l - 2rs)\ln\left(\frac{a+w-rs}{a+rs}\right)\right] \quad (3)$$

Where Vout=voltage across the two coils wired in series;

$$\frac{dI}{dt} = \text{rate of change of current through the power bus;}$$

K=the number of coils;
N=the number of turns;
a=a distance from the center of the bus bar to the edge of the coil;
w=the width of the coil;
l=the length of the coil; and
s=the spacing between turns in each coil.
For the dual-coil, five turn exemplary embodiment shown in FIGS. 1A and 1B, the series can be evaluated as:

$$V_{out} = 2M\frac{dI}{dt} \quad (4)$$

$$M = \underbrace{\int_a^{a+w}\frac{\mu_0}{2\pi x}(l)\,dx}_{turn1} + \underbrace{\int_{a+s}^{a+w-s}\frac{\mu_0}{2\pi x}(l-2s)\,dx}_{turn2} + \underbrace{\int_{a+2s}^{a+w-2s}\frac{\mu_0}{2\pi x}(l-4s)\,dx}_{turn3} + \underbrace{\int_{a+3s}^{a+w-3s}\frac{\mu_0}{2\pi x}(l-6s)\,dx}_{turn4} + \underbrace{\int_{a+4s}^{a+w-4s}\frac{\mu_0}{2\pi x}(l-8s)\,dx}_{turn5} \quad (5)$$

The voltage signal is indicative of the rate of change of current with time and in this manner the arc fault detector 16 may determine if the rate of change is in excess of a permitted maximum rate-of-change.

The more turns per coil and the more layers used per coil the greater the coupling between the dI/dt and the coil output voltage Vout. The relationship between the coil length and the output voltage is linear, yet the relationship of Vout to the coil width is proportional to that of the ratio of ln(b/a), so a greater increase in w or b (FIG. 1B) is required to give any notable increase in coupling, therefore maximizing the length of the coil is desirable if possible.

Figure 3:
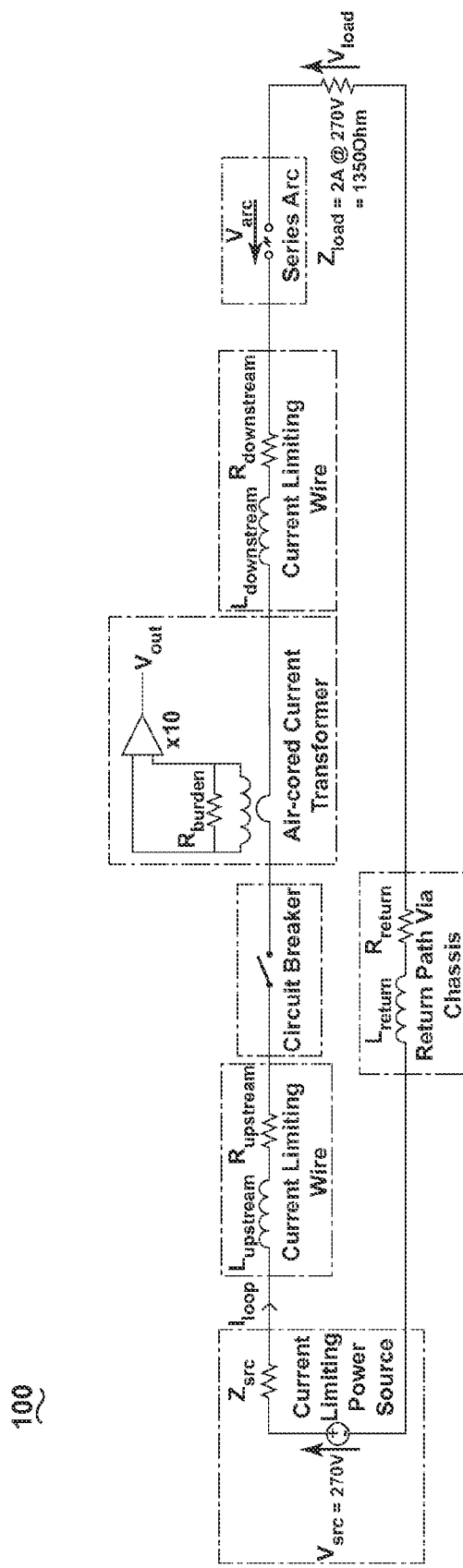
FIG. 3 is a schematic diagram of an exemplary test circuit configuration according to an embodiment of the invention.
Figure 4A:
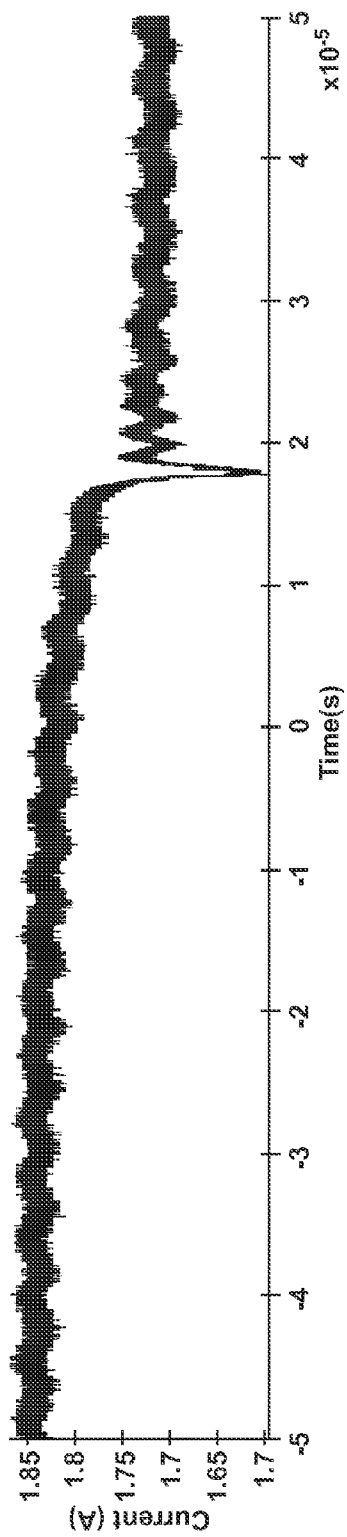
FIG. 4A illustrates a plot of the current running through a series arc fault in the circuit illustrated in FIG. 3
Figure 4B:
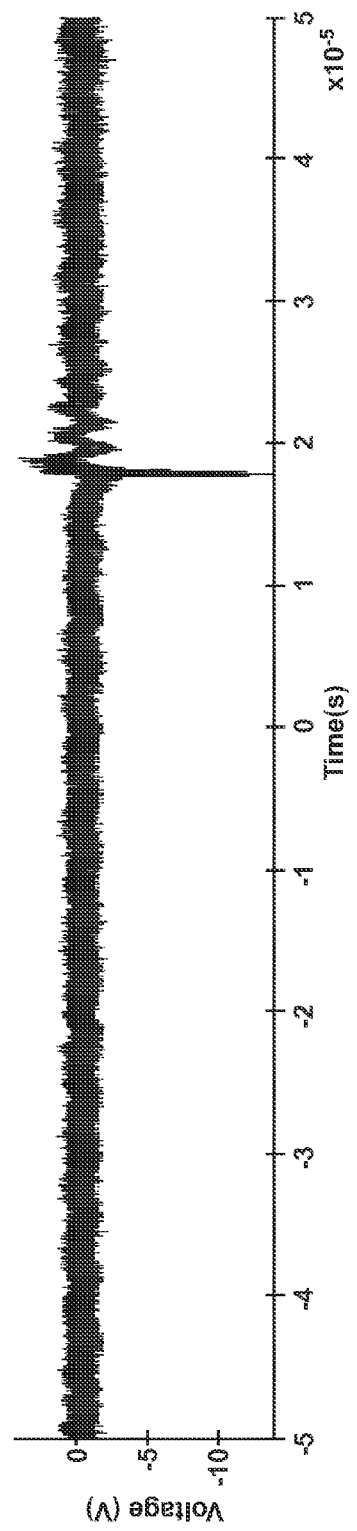
FIG. 4B illustrates a plot of the response of the amplified air-cored coil output voltage.

FIG. 3 illustrates an exemplary test configuration circuit 100 having a Vout output, according to an embodiment of the invention. In the test configuration circuit 100, dual air-cored coils with dimensions l=38 mm, w=5 mm, a=10 mm, therefore b=15 mm, were tested. The series arc fault was created on a vibration table containing a loose terminal configuration under random vibration in accordance with SAE AS5692 standards. The testing was carried out with a 270 volt DC line voltage. The plot in FIG. 4A illustrates the current running through a series arc fault in the circuit 100 illustrated in FIG. 3 as a loose terminal is shaken whilst energized. The plot in FIG. 4B illustrates the response of the amplified air-cored coil output voltage which shows a negative pulse during the negative dI/dt event caused by the striking of a series arc fault. The amplitude of the pulse is amplified by 10 during the arc fault.

The above described embodiments provide a variety of benefits including the ability to detect series and/or parallel arc faults in AC and DC systems and is particularly useful for detecting series arc faults in high voltage systems. The embodiments described above may be used for detecting arc faults both internal and external to the PCB. The air-cored current transformer provides a means of determining the dI/dt signal in a power distribution feeder without having to measure absolute current and subsequently having the overhead of differentiating this signal. The above embodiments also give improved dynamic range of the dI/dt signal compared to differentiating an absolute current signal. The above described embodiments also provide galvanic isolation of the current measuring system, which allows flexibility in any signal processing circuitry required. In high voltage systems, the current sense amplifier for the sensor used does not have to float on the line voltage like a current sense amplifier for a high-side shunt current sensor would need to. The above described embodiments may detect AC components of high magnitude DC currents without saturating and provide good rejection against far-field interference sources found in aircraft environments. The solution requires very few peripheral components and is inexpensive to implement compared to alternative solutions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A printed circuit board (PCB) comprising:
a plurality of electrical components;
a power conductor configured to couple to a power supply external to the PCB and provide power to the plurality of electrical components; and
an arc fault detector comprising a first air-cored transformer located in proximity to the power conductor to couple with a magnetic field generated by current passing through the power conductor and providing an output voltage, Vout, which is proportional to the rate of change of the current, dI/dt, passing through the power conductor.

2. The PCB of claim 1 wherein the arc fault detector further comprises a signal processing circuit that receives Vout and determines a presence of an arc fault.

3. The PCB of claim 2, further comprising at least one of a relay and a SSPC uncoupling the power conductor from the power supply when the arc fault is determined.

4. The PCB of claim 1 wherein the arc fault detector further comprises a second air-cored transformer wired in series and in anti-phase with respect to the first air-cored transformer and the voltage across the first and second air-cored transformers is Vout.

5. The PCB of claim 4 wherein the first and second air-cored transformers are located proximate the power conductor to constructively add positive and negative components of the magnetic field generated by the current passing through the power conductor.

6. The PCB of claim 5 wherein the first and second air-cored transformers are wired in anti-phase to effect the constructive adding of the positive and negative components of the magnetic field.

7. The PCB of claim 6 wherein the first and second air-cored transformers comprise a first and second coil, respectively.

8. The PCB of claim 7 wherein each of the first and second coils is formed by a winding wound in a same rotational direction.

9. The PCB of claim 8 wherein each coil comprises at least one spiral.

10. The PCB of claim 9 wherein each coil comprises multiples spirals arranged at different layers in the PCB.

11. The PCB of claim 8 wherein the winding comprises a trace on the PCB.

12. The PCB of claim 1 wherein the first air-cored transformer comprises a first coil.

13. The PCB of claim 12 wherein the first coil is formed by a winding wound in a same rotational direction.

14. The PCB of claim 13 wherein the coil comprises at least one spiral.

15. The PCB of claim 14 wherein the coil comprises multiples spirals arranged at different layers in the PCB.

16. The PCB of claim 15 wherein the winding comprises a trace on the PCB.

17. The PCB of claim 1 wherein the power conductor comprises a bus bar.

18. A method of detecting an arc fault using a power conductor on a printed circuit board (PCB), which supplies power from an external power source to electrical components on the PCB, the method comprising:
sensing a value indicative of a rate of change of current passing through the power conductor by an air-cored transformer located on the printed circuit board; and
determining an arc fault condition based on the sensed value.

19. The method of claim 18 comprising sensing the value from at least two air-cored transformers located proximate the power conductor to constructively add positive and negative components of a magnetic field generated by the current passing through the power conductor.

20. The method of claim 18, further comprising disconnecting the power conductor from the external power source.

21. The method of claim 20 wherein the external power source is at least 60 volts.

22. The method of claim 21 wherein the external power source is at least 220 volts.

\* \* \* \* \*